United States Patent
Hsu et al.

[11] Patent Number: 6,037,013
[45] Date of Patent: Mar. 14, 2000

[54] BARRIER/LINER WITH A SINX-ENRICHED SURFACE LAYER ON MOCVD PREPARED FILMS

[75] Inventors: Wei-Yung Hsu; Qi-Zhong Hong; Jiong-Ping Lu, all of Dallas, Tex.

[73] Assignee: Texas Instruments Incorporated, Dallas, Tex.

[21] Appl. No.: 09/034,269

[22] Filed: Mar. 4, 1998

Related U.S. Application Data

[60] Provisional application No. 60/037,193, Mar. 6, 1997.

[51] Int. Cl.$^7$ .............................. B05D 3/06; C23C 16/30
[52] U.S. Cl. .................................. 427/535; 427/255.394; 427/255.4; 427/397.7; 427/255.7; 438/653; 438/672; 438/681
[58] Field of Search .......................... 427/535, 397.7, 427/255.28, 255.394, 255.4, 255.7; 438/653, 672, 681

[56] References Cited

U.S. PATENT DOCUMENTS

| | | | |
|---|---|---|---|
| 5,591,672 | 1/1997 | Lee et al. | 437/190 |
| 5,614,437 | 3/1997 | Choundhury | 437/140 |
| 5,705,442 | 1/1998 | Yen et al. | 438/653 |

*Primary Examiner*—Roy V. King
*Attorney, Agent, or Firm*—Jacqueline J. Garner; Wade James Brady III; Richard L. Donaldson

[57] ABSTRACT

A barrier/liner structure (10) and method. First, a porous nitride layer (12) is formed over a structure (18), for example, by metal-organic CVD (MOCVD). Then, the porous nitride layer (12) is exposed to a silicon- (or dopant-) containing ambient to obtain a silicon-(or dopant) rich surface layer (14). Finally, the silicon- (or dopant) rich surface layer (14) is nitrided to obtain a silicon-nitride (or dopant-nitride) enriched surface layer (16).

26 Claims, 3 Drawing Sheets

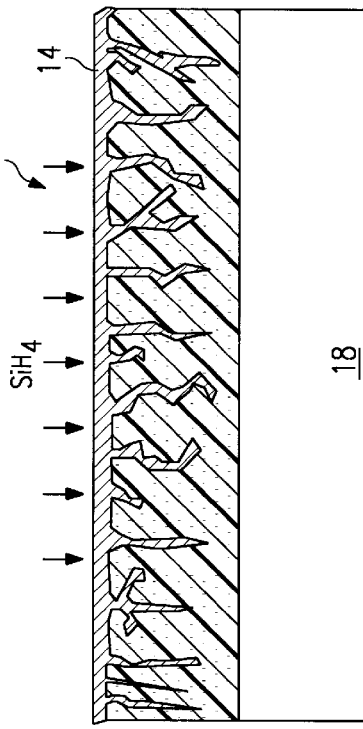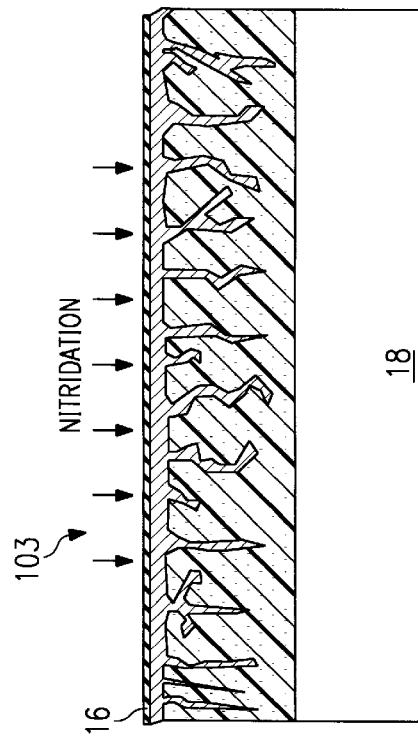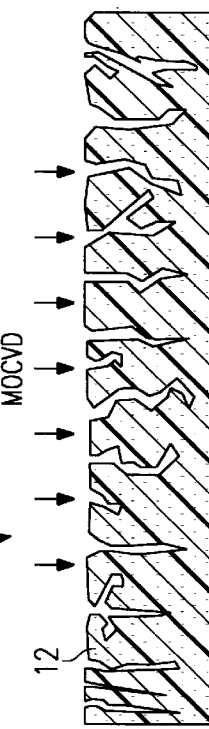

BARRIER/LINER WITH A SINX-ENRICHED SURFACE LAYER ON MOCVD PREPARED FILMS

CROSS-REFERENCE TO RELATED CO-PENDING APPLICATIONS

This application claims priority under 35 USC § 119 (e) (1) of provisional application number 60/037,193, filed Mar. 6, 1997.

The following co-assigned patent application is related and is hereby incorporated by reference:

| Serial No. | Filing date | Inventor(s) |
| --- | --- | --- |
| 08/784,657 | 1-21-97 | Ha Nguyen |

FIELD OF THE INVENTION

This invention generally relates to the semiconductor devices and their fabrication, and more specifically to barrier/liner films for metal interconnects.

BACKGROUND OF THE INVENTION

Barrier/liner films are critical components in multilevel interconnect technology, particularly important for Cu and Al metalization. Cu is known to be able to diffuse into Si, $SiO_2$ and other dielectric films. Al in contact with Si or suicides have problems associated with "junction-spiking". Good gap-fill of Cu/Al also requires a proper liner to help reflow. High quality barrier/liner films are therefore essential for the success of both Cu and Al metalization.

The most common barrier films used in microelectronics industry today are TiN-based thin films. At present, TiN-based barrier films are mainly prepared by physical vapor deposition (PVD) using reactive sputtering, with or without collimation. However, sputtering is a line-of-sight technique and produces films with poor step coverage. As the minimum feature size shrinks and the aspect ratio of contact/via/trench increases, processes that produce conformal films are required. Another problem associated with PVD films is that the films have columnar structures and provide easy diffusion paths. This is particularly severe when device minimum feature continues to shrink and thickness of barrier/liners continues to decrease.

Chemical-vapor-deposition (CVD) processes deposit films with improved step coverage. Although much work has been reported on CVD barrier films, many of the reported processes cannot satisfy the strict requirements needed for semiconductor device fabrication. To be production-worthy, a process should produce high quality films with low defect density (low particle counts), have adequate throughput, and use highly reliable equipment.

Two types of CVD processes are used currently: one based on inorganic precursors, such as $TiCl_4/NH_3$, and the other based on metal-organic precursors, such as tetrakis (dimethylamino)-titanium (TDMAT) and tetrakis (diethylamino)-titanium (TDEAT). The inorganic based processes require high deposition temperatures (>550° C.), leave corrosive impurities (e.g. Cl) in the films and have problems associated with particulate formation (e.g. $NH_4Cl$). CVD processes using metal-organic precursors (MOCVD) still are not well-established. Thermal decomposition of TDMAT or TDEAT produces films with high resistivity, which increases upon exposure to air. Adding $NH_3$ into the reactant mixture improves the resistivity; however, the step coverage is adversely affected and $NH_3$ addition introduces gas phase reactions, a potential source for particle generation. An in-situ plasma treatment of TDMAT thermal decomposed films was also reported. However, this process has very low throughput due to limited penetration depth of plasma and requires special hardware.

SUMMARY OF THE INVENTION

A barrier/liner structure and method are disclosed herein to overcome the problems described above with the prior art. First, a porous nitride layer is formed over a structure, for example, by metal-organic CVD (MOCVD). Then, the porous nitride layer is exposed to a silicon- (or dopant-) containing ambient to obtain a silicon-(or dopant) rich surface layer. Finally, the silicon- (or dopant) rich surface layer is nitrided to obtain a silicon-nitride (or dopant-nitride) enriched surface layer.

An advantage of the invention is providing a barrier/liner that is based on MOCVD of transition metal nitride, with Si incorporation in the film and SiNx— enriched surface.

Another advantage of the invention is providing a process that minimizes the probability of particulate formation due to gas phase reaction using only one reactive compound in each step.

Another advantage of the invention is providing a process for forming an improved barrier/liner that is simple and can be performed in commercial CVD reactors.

Another advantage of the invention is providing a barrier/liner having excellent step coverage, and that is extendible to future generations of metalization technology.

Another advantage of the invention is providing a process for forming a barrier/liner using low substrate temperatures (<500° C.) applicable for multilevel metalization.

BRIEF DESCRIPTION OF THE DRAWINGS

In the drawings:

FIG. 1 is a cross-sectional diagram of a barrier/liner according to the invention;

FIGS. 2A–2C are cross-sectional diagrams of the barrier/liner of FIG. 1 at various stages of fabrication;

Corresponding numerals and symbols in the different figures refer to corresponding parts unless otherwise indicated.

DETAILED DESCRIPTION OF PREFERRED EMBODIMENTS

Figure 3:
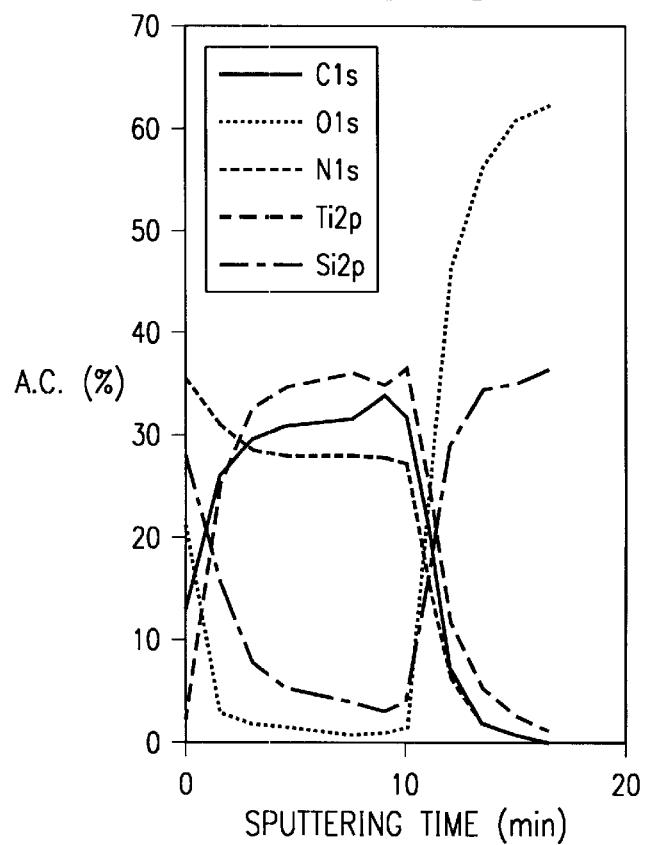
FIG. 3 is a XPS depth profile for silane treated and plasma nitrided films.

The invention is a barrier/liner and will be described in conjunction with forming contacts and vias for metal interconnect layers. However, it should be noted that this class of embodiments provides only a few examples of the many advantageous uses of the innovative teachings herein.

FIG. 1 is a cross-section of the barrier/liner 10 according to the invention. Barrier/liner 10 is formed on a semiconductor structure 18 such as in a contact or via hole as will be described further herein below. Barrier/liner 10 comprises a metal-nitride layer 12. The preferred material for metal-nitride layer 12 is TiN. However, other refractory-metal nitrides such as tantalum-nitride and tungsten-nitride, may alternatively be used. Due to various processing steps described below, metal-nitride layer 12 may also include carbon. Metal-nitride layer 12 is a porous layer that allows a silicon- (or dopant) rich surface layer 14 to extend therein. Preferably, layer 14 comprises a silicon-rich or boron-rich material. A silicon-nitride or dopant-nitride enriched surface layer 16 is located on silicon rich layer 14. Layer 16 is very thin, typically on the order of 1 nm.

A process for forming barrier/liner 10 according to the invention will now be described in conjunction with FIGS. 2A–2C. FIG. 2B shows semiconductor body 18 processed as desired and prepared for the formation of a barrier/liner. For example, semiconductor body 18 may be processed through the formation, pattern and etch of an interlevel dielectric layer (not shown).

The barrier/liner 10 process may be performed in a CVD reactor system, such as Applied Materials' model P-5000. Example processing conditions described below are based on this reactor and actual processing condition will vary somewhat depending on the type of CVD reactor used. Referring to FIG. 2B, the process begins with deposition of a porous nitride film 12 (step 101). A preferred embodiment of this step is the thermal decomposition of TDMAT. However, other metal organic precursors may alternatively be used for a MOCVD process. The semiconductor body 18 is first transferred to a pre-heated sample holder (with typical temperatures in the range of 375–500° C.) in a CVD reactor. The TDMAT liquid precursor is then introduced into the reactor using He carrier gas (or other inert gases) for a designated duration based on thickness requirement. Films deposited by this step has porous structure and contains Ti, N and C. Some typical processing conditions are summarized as follows:

TABLE I

Typical Processing Conditions for Step 101

| | |
|---|---|
| TDMAT flow: | 10–500 sccm |
| $N_2$ diluent flow: | 50–500 sccm |
| Susceptor Temp: | 375–500° C. |
| Reactor Pressure: | 0.2–5 torr |

Alternatively, porous nitride film 12, may be formed using a PVD process. By adjusting the deposition parameters of a PVD TiN (e.g., at lower temperatures or higher pressure), a porous PVD TiN can be obtained for nitride layer 12.

Referring to FIG. 2C, the thermally decomposed film (layer 12) is then exposed to a Si containing ambient, preferably to a $SiH_4$ gas (step 102). This step can be performed in the same chamber as step 101 or in a separate chamber in the same cluster tool. It is critical that no air-exposure occurs after step 101 and prior to step 102. The susceptor temperature is preferably the same for both step 101 and step 102. Some typical processing conditions for this step are summarized as follows:

TABLE II

Typical Processing Conditions for Step 102

| | |
|---|---|
| $SiH_4$ flow: | 50–1000 sccm |
| Susceptor Temp: | 375–500° C. |
| Reactor Pressure: | 0.5–15 torr |

Thin films prepared after step 102 contains Si-rich surface layer 14. A nitridation step (step 103) is then carried out to form a barrier/liner film 10 with an ultra-thin SiNx-enriched surface layer 16, as shown in FIG. 1. The nitridation step can be performed either in the same chamber as previous steps or in a separated chamber. It is critical that no air-exposure occurs after step 102 and prior to step 103. The nitridation is preferably formed by $N_2/H_2$ plasma or $NH_3/N_2$ plasma. Some typical processing conditions for this step using either types of plasma are summarized as follows:

TABLE IIIA

Typical Processing Conditions for Step 103 using $N_2/H_2$ Plasma

| | |
|---|---|
| $N_2$ flow: | 100–1000 sccm |
| $H_2$ flow: | 100–1000 sccm |
| Susceptor Temp: | 375–500° C. |
| Reactor Pressure: | 0.5–15 torr |
| Plasma Power: | 200–500 W |

TABLE IIIB

Typical Processing Conditions for Step 103 Using N2/NH3 Plasma

| | |
|---|---|
| $N_2$ flow: | 100–1000 sccm |
| $NH_3$ flow: | 50–500 sccm |
| Susceptor Temp: | 375–500° C. |
| Reactor Pressure: | 0.5–15 torr |
| Plasma Power: | 100–500 W |

Barrier/liner 10 prepared using the above described process (i.e. 101+102+103) has excellent stability upon exposure to air, with no detectable increase in sheet resistance after three days in air. Chemical composition analysis using x-ray photoelectron spectroscopy (XPS) showed that the thin film has an ultra-thin SiNx layer on the surface, evidenced by the Si 2p binding energy (101.9 eV) and depth profile data (FIG. 3). The formation of surface SiNx 16 is particularly important for Cu metalization, because SiNx is an excellent barrier against Cu diffusion. SiNx is an insulating materials and conventionally prepared SiNx films are too thick for metalization applications. The novel process of current invention produces conducting barrier films 10 with ultra-thin SiNx 16 on the surface and is very usefull for Cu metalization. The film 10 has excellent conformality, an important property for applications in device features with small dimensions.

Figure 4:
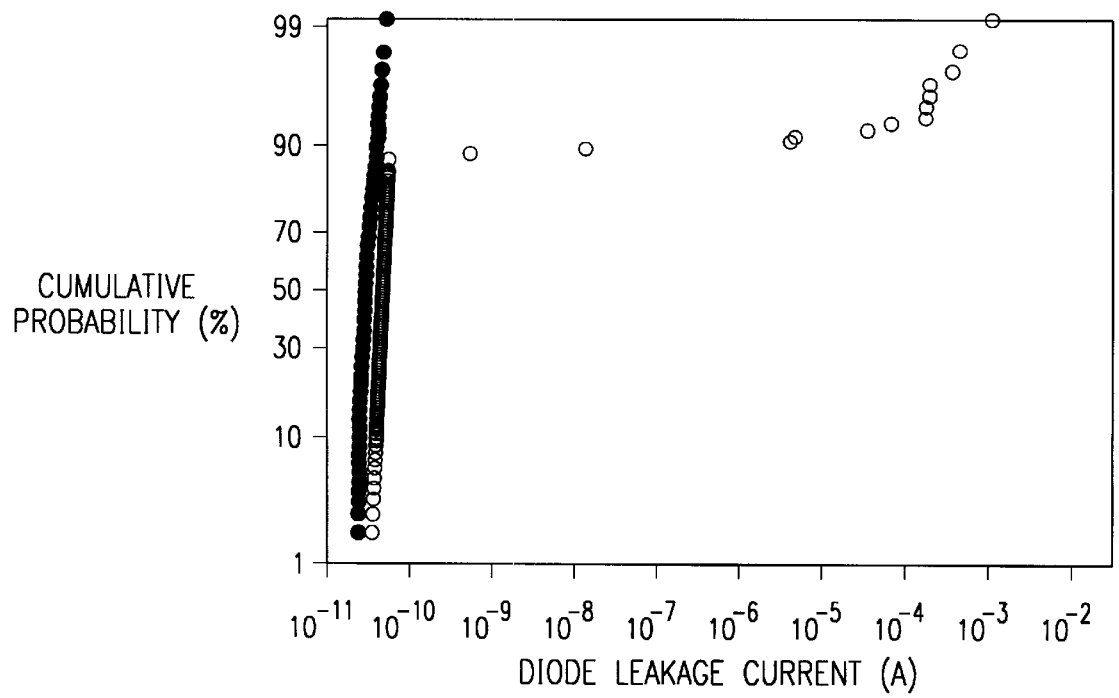
FIG. 4 is a graph of diode leakage current measurements for Cu/barrier structures.

Barrier/liner 10 prepared with this new process exhibited good barrier properties for Cu metalization, as shown by the diode leakage data in FIG. 4. After thermal stress at 500° C. for 30 minutes, the Cu metalization structure using the barrier film 10 prepared by the current invention showed low leakage current with tight distribution.

The barrier/liner 10 prepared using the current invention have also been shown to be good liner/barrier for Al metalization. Table IV compares sheet resistance measurement data for a 200 nmAl/20 nm barrier structures, with barrier films prepared using the current invention and the PVD TiN control film:

TABLE IV

Sheet Resistance Measurement

| Barrier Film | Sheet Resistance Increase after 500° C. for 1 hr |
|---|---|
| PVD TiN control | 93% |
| Silane and plasma treated film | 38% |

Alternate Process Embodiments

The novel approach described herein can have different process embodiments than those described above. As an example, the starting precursor is not necessary to be TDMAT. Alternate precursors include: tetrakis (dimethylamindo) titanium (TDEAT) and tetrakis (methylethylamindo) titanium (TMEAT). It can also be other transition metal (e.g. W and Ta) organometallic precursors, if alternate barriers containing W and Ta instead of Ti are needed.

Reactive ambient used in step 102 is $SiH_4$. This gas can be replaced by $Si_2H_6$ as an alternate Si source, or $B_2H_6$ if BNx surface-enriched layer instead of SiNx layer is needed. Other potential dopants include Al, Ga and Ge, using diemthyl aluminum hydride (DMAH), trimethyl gallium (TMG), germane ($GeH_4$) respectively).

The nitridation step (103) can be achieved using other nitrogen-containing plasma, such as $N_2/H_2/Ar$ and $NH_3/Ar$ or other active nitrogen sources (including non-plasma sources) such as methylhydrazine.

Example Metalization Embodiments

Figure 5A:
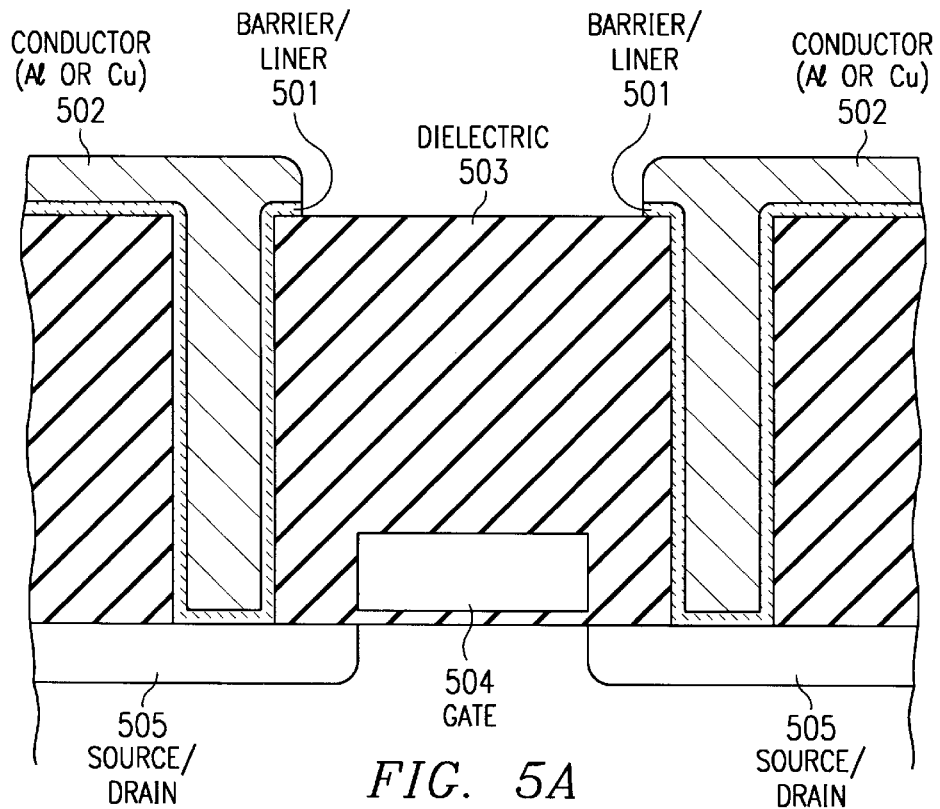
FIG. 5A–5B are cross-sectional diagrams of applications for the barrier/liner according to the invention.
Figure 5B:
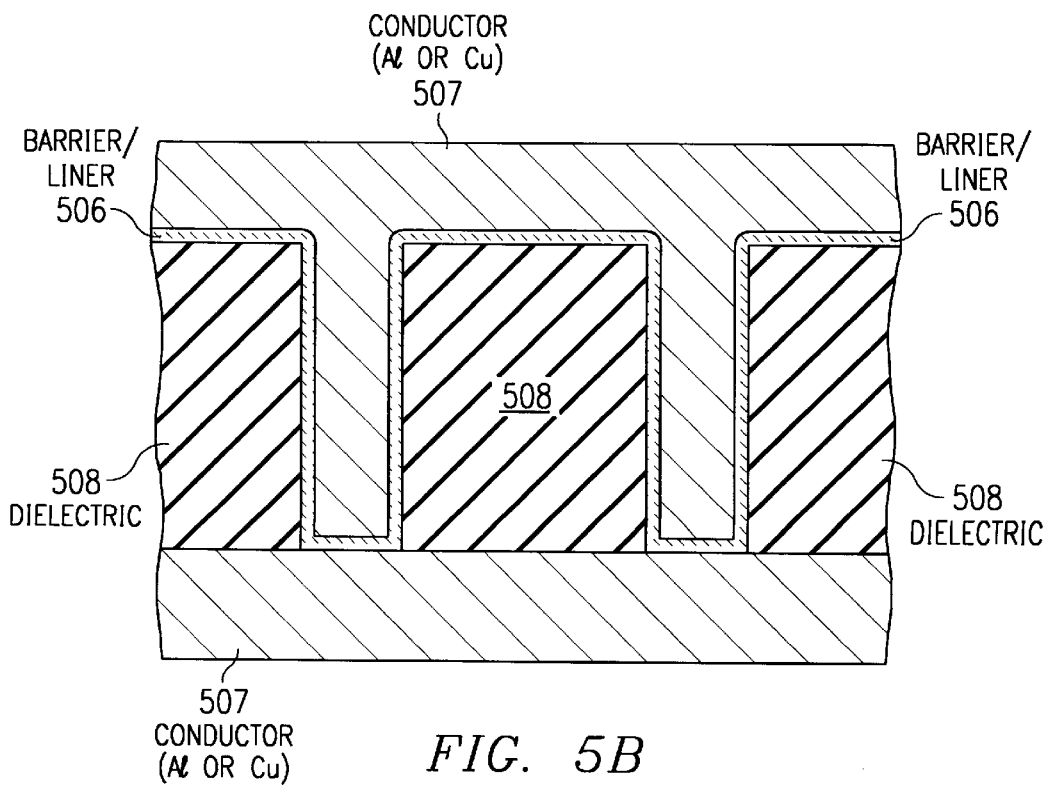

Thin films prepared using the above described process have a wide range applications in metalization technologies. FIG. 5A–5B give two examples of the applications: (A) barrier/liner 501 for contact and (B) barrier/liner 506 for via or metal lines. Barrier/liner 501 is formed in a contact hole 510 that extends through an interlevel dielectric 503 to a source/drain region 505. The metal interconnect 502, either aluminum or copper, is then formed on barrier/liner 501 both in the contact hole 510 and on the surface of dielectric layer 502 where interconnection is desired. For metal line fabrication (FIG. 5B), barrier/liner 506 is formed on the trench structure 510, followed by the deposition of metal interconnect 507 (e.g. Cu). The contact hole 510 extends through interlevel dielectric layer 508 to connect two metal interconnects 507 to each other. The metal interconnect 507 and barrier 506 above the contact hole 510 (shown by the dot line) are then removed by chemical-mechanical polishing (CMP).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a barrier liner on a structure;
   forming a porous metal nitride layer over said structure;
   exposing said porous metal nitride layer to a silicon-containing ambient to obtain a silicon-containing layer at a surface of said porous metal nitride layer;
   nitriding said silicon-containing layer to obtain a silicon-nitride enriched surface layer over said porous metal nitride layer.

2. The method of claim 1, wherein the step of forming a porous metal nitride layer comprises the step of chemical-vapor depositing said porous metal nitride layer using a metal-organic precursor.

3. The method of claim 2, wherein said metal organic precursor comprises tetrakis(dimethylamino)-titanium (TDMAT).

4. The method of claim 2, wherein said metal-organic precursor comprises tetrakis(diethylamino)-titanium (TDEAT).

5. The method of claim 2, wherein said metal organic precursor comprises tetrakis (methylethylamindo) titanium (TMEAT).

6. The method of claim 2, wherein said chemical vapor depositing step further comprises the step of heating the structure to a temperature in the range of 375–500° C.

7. The method of claim 2, wherein the precursor is a liquid and further comprising the step of introducing said precursor with an inert gas.

8. The method of claim 2, wherein said chemical vapor depositing step occurs at a pressure in the range of 0.2 to 5 torr.

9. The method of claim 1, wherein said porous metal nitride layer comprises titanium, nitride, and carbon.

10. The method of claim 1, wherein said porous metal nitride layer comprises tantalum and nitride.

11. The method of claim 1, wherein said porous metal nitride layer comprises tungsten and nitride.

12. The method of claim 1, wherein said silicon ambient comprises silane.

13. The method of claim 1, wherein said nitriding step uses a $N_2/H_2$ plasma.

14. The method of claim 1, wherein said nitriding step uses a $N_2/NH_3$ plasma.

15. The method of claim 1, wherein said nitriding step occurs at a temperature in the range of 375–500° C., at a pressure in the range of 0.5–15 torr, and a plasma power in the range of 100–500 W.

16. A method of forming a barrier liner In a trench, comprising the steps of:
   forming a porous metal nitride layer in said trench using metal organic chemical vapor deposition (MOCVD);
   exposing said porous metal nitride layer to a silicon-containing ambient to obtain a silicon-containing layer;
   nitriding said silicon-containing layer to obtain a silicon-nitride enriched surface layer over said porous metal nitride layer using a nitride containing plasma.

17. The method of claim 16, wherein said porous metal nitride layer comprises titanium, nitride, and carbon.

18. The method of claim 16, wherein said porous metal nitride layer comprises tantalum and nitride.

19. The method of claim 16, wherein said porous metal nitride layer comprises tungsten and nitride.

20. The method of claim 16, wherein said nitriding step uses a $N_2/H_2$ plasma.

21. The method of claim 16, wherein said nitriding step uses a $N_2/NH_3$ plasma.

22. The method of claim 16, wherein said nitriding step occurs at a temperature in the range of 375–500° C., at a pressure in the range of 0.5–15 torr, and a plasma power in the range of 100–500 W.

23. A method of forming a barrier liner in a trench, comprising the steps of:
   forming a porous metal nitride layer in said trench using metal organic chemical vapor deposition (MOCVD);
   exposing said porous metal nitride layer to a boron-containing ambient to obtain a boron-containing layer;
   nitriding said boron-containing surface layer to obtain a boron-nitride enriched surface layer over said porous metal nitride layer using a nitride containing plasma.

24. The method of claim 23 wherein said nitriding step uses a $N_2/H_2$ plasma.

25. The method of claim 23, wherein said nitriding step uses a $N_2/NH_3$ plasma.

26. The method of claim 23, wherein said nitriding step occurs at a temperature in the range of 375–500° C., at a pressure in the range of 0.5–15 torr, and a plasma power in the range of 100–500 W.

* * * * *